United States Patent
Moore

(10) Patent No.: US 7,491,605 B2
(45) Date of Patent: Feb. 17, 2009

(54) ZERO COST NON-VOLATILE MEMORY CELL WITH WRITE AND ERASE FEATURES

(75) Inventor: Paul M. Moore, San Mateo, CA (US)

(73) Assignee: Micrel, Inc., San Jose, CA (US)

( * ) Notice: Subject to any disclaimer, the term of this patent is extended or adjusted under 35 U.S.C. 154(b) by 269 days.

(21) Appl. No.: 11/225,429

(22) Filed: Sep. 12, 2005

(65) Prior Publication Data
US 2006/0008980 A1    Jan. 12, 2006

Related U.S. Application Data

(62) Division of application No. 10/285,977, filed on Nov. 1, 2002, now Pat. No. 6,949,784.

(51) Int. Cl.
*H01L 21/8242* (2006.01)
(52) U.S. Cl. ............... 438/252; 438/250; 438/251; 438/257; 438/275; 438/276; 438/279; 438/289; 438/291
(58) Field of Classification Search ......... 438/250–252, 438/257, 275–276, 279, 289, 291
See application file for complete search history.

(56) References Cited

U.S. PATENT DOCUMENTS

| 4,970,565 | A | 11/1990 | Wu et al. |
|---|---|---|---|
| 5,081,052 | A | 1/1992 | Kobayashi et al. |
| 5,841,165 | A | 11/1998 | Chang et al. |
| 5,969,992 | A | 10/1999 | Mehta et al. |
| 6,025,625 | A | 2/2000 | Chi |
| 6,324,097 | B1 | 11/2001 | Chen et al. |
| 6,031,771 | A1 | 1/2004 | Hashimoto et al. |
| 2002/0005543 | A1 | 1/2002 | Di Pede et al. |
| 2004/0084705 | A1 | 5/2004 | Moore |

OTHER PUBLICATIONS

European Search Report, 3 pages.
Stanley Wolf Ph.D., "Silicon Processing For The VLSI Era, vol. 2: Process Integration," Paper, Lattice Press, 1990, pp. 492-548, 431 (5 pages total).
European Examination Report, 7 pages.

*Primary Examiner*—Kevin M Picardat
*Assistant Examiner*—Bac H Au
(74) *Attorney, Agent, or Firm*—Patent Law Group LLP; David C. Hsia

(57) ABSTRACT

A method for making a semiconductor structure of a memory device includes forming a capacitor having a gate dielectric between a gate conductor and a dopant region of a first conductivity type located in another dopant region of a second conductivity type, forming a bipolar transistor having a base region of the first conductivity type, and forming a field-effect transistor having a gate conductor coupled to the gate conductor of the capacitor, wherein the dopant region and the base region of the first conductivity type are formed in the same step to avoid additional cost in forming the capacitor.

15 Claims, 4 Drawing Sheets

ZERO COST NON-VOLATILE MEMORY CELL WITH WRITE AND ERASE FEATURES

CROSS REFERENCE TO RELATED APPLICATIONS

This application is a divisional of application Ser. No. 10/285,977, filed Nov. 1, 2002, now U.S. Pat No. 6,949,784 which is incorporated herein by reference.

FIELD OF INVENTION

This invention relates to memory cells and more particularly to nonvolatile memory cells.

DESCRIPTION OF RELATED ART

FIGS. 1A and 1B illustrate cross-sections of a zero-cost flash memory device 100 (shown in a circuit diagram in FIG. 1C) that can be made in a conventional CMOS (complimentary metal oxide semiconductor) process. Specifically, FIG. 1A illustrates an n-type field-effect transistor 150 (FIG. 1C) that consists of a floating gate 112A, a gate dielectric 11A, an n+ source region 118, an n+ drain region 120, NLDD (n⁻ lightly-dope drain) regions 114, and spacers 116. Field-effect transistor 150 (also known as a "memory transistor") is usually formed in a p-well 108 in a p-substrate 102 or directly in p-substrate 102. Source region 118 and drain region 120 are respectively coupled to a source terminal 156 and a drain terminal 158. Field oxide 106 is formed around field-effect transistor 150.

FIG. 1B shows a coupling capacitor (denoted as coupling capacitor 152 in FIG. 1C) that is formed by an n-well 104 and a gate conductor 1112B separated by a gate dielectric 10B. In general, gate conductor 112B and floating gate 112A are electrically coupled by using the same conducting trace. An n⁺ contact region 122 is formed in n-well 104 as a contact for coupling one plate of coupling capacitor 152 to a control terminal 160. As a result of forming coupling capacitor 152 on a p-type substrate, a PN junction (denoted as diode 154 in FIG. 1C) is formed between p-substrate 102 and n-well 104. Field oxide 106 is formed around field-effect transistor 152.

FIG. 1C illustrates an equivalent circuit diagram representing memory device 100. Coupling capacitor 152 has one plate coupled to control terminal 160 and another plate coupled to floating gate 112A of memory transistor 150. To write, read, and erase memory transistor 150, various voltages are applied to control terminal 160, source terminal 156, and drain terminal 158.

One disadvantage of memory device 100 is that when voltage is applied to control terminal 160, the depletion region under gate dielectric 110B will extend into n-well 104. This decreases the capacitance of coupling capacitor 152 in response to the voltage applied. When the capacitance of coupling capacitor 152 is decreased, higher voltages will need to be applied to write and erase memory device 100. Thus, source region 118 and drain region 120 are specially engineered with greater breakdown voltage characteristics to withstand the higher voltages.

Another disadvantage of memory device 100 is that control terminal 160 must be kept more positive than substrate 102 to reverse bias the PN junction denoted by diode 154. If the n-well to p-substrate junction is forward biased, a substrate current will flow and affect device operation. Thus, only positive voltages can be applied to control terminal 160 to program memory device 100. Accordingly, a large voltage must be applied to drain terminal 158 to achieve the necessary potential difference with control terminal 160 to erase memory device 100 when control terminal 160 is grounded or kept positive. Thus, drain region 120 are specially engineered with greater breakdown voltage characteristics to withstand the large applied voltages.

Thus, what is needed is a memory device that addresses the disadvantages of memory device 100.

SUMMARY OF THE INVENTION

In one embodiment of the invention, a method for making a semiconductor structure of a memory device includes forming a capacitor having a gate dielectric between a gate conductor and a dopant region of a first conductivity type located in another dopant region of a second conductivity type, forming a bipolar transistor having a base region of the first conductivity type, and forming a field-effect transistor having a gate conductor coupled to the gate conductor of the capacitor, wherein the dopant region and the base region of the first conductivity type are formed in the same step to avoid additional cost in forming the capacitor.

DETAILED DESCRIPTION

In accordance with the invention, a memory device includes a coupling capacitor having one plate coupled to a gate of a field-effect transistor (FET) and one plate coupled to a control terminal. The coupling capacitor is formed from (1) a first dopant region (e.g., a p-type region) in a second dopant region (e.g., an n-well) on a substrate (e.g., a p-substrate), (2) a gate dielectric atop the first dopant region, and (3) a gate conductor atop the gate dielectric. A voltage can be applied to the second dopant region to isolate the coupling capacitor from the substrate by reverse biasing a PN junction between the first dopant region and the second dopant region. With the PN junction reverse biased, a negative voltage can be applied to the control terminal to program the field-effect transistor. For example, to erase the memory device, a negative voltage can be applied to the control terminal while the source is grounded and the drain is floated.

Figure 1A:
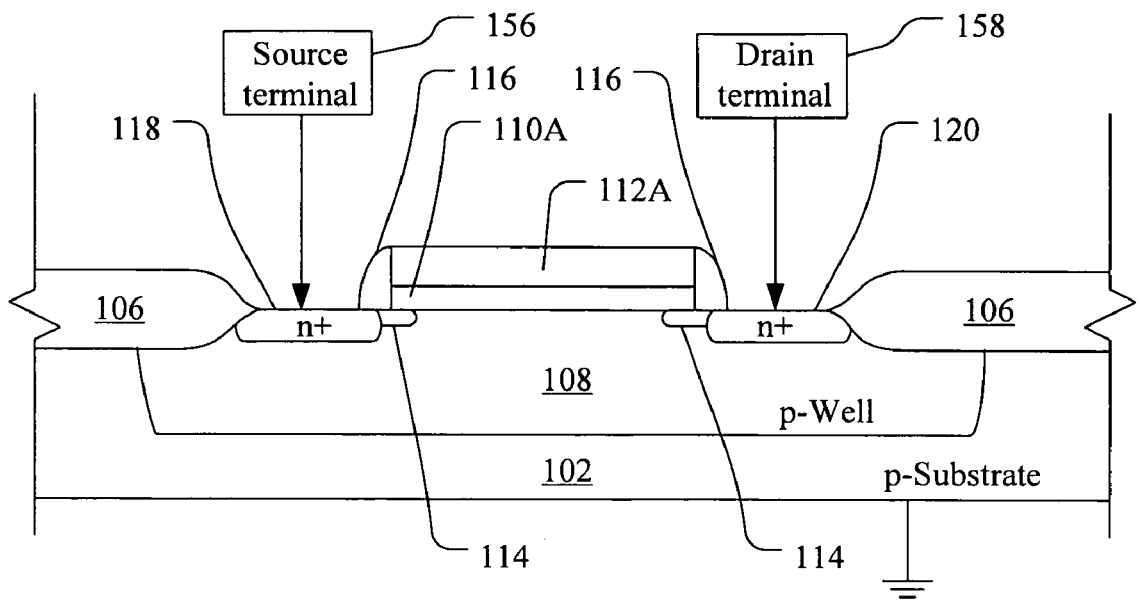
FIGS. 1A and 1B illustrate cross-sections of a zero-cost nonvolatile memory device created from a conventional CMOS process.
Figure 2A:
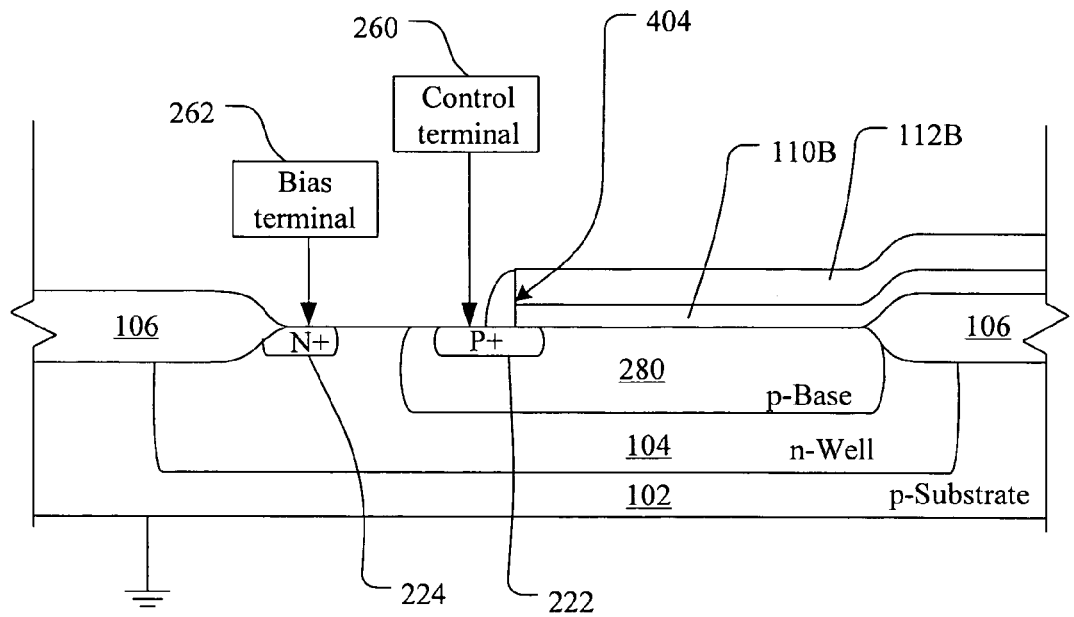
FIG. 2A illustrates a cross-section of a portion of a nonvolatile memory device in one embodiment of the invention.

In one embodiment of the invention, a flash memory device 200 (shown in an equivalent circuit diagram in FIG. 2B) includes a coupling capacitor with a structure shown in FIG. 2A. The coupling capacitor has one plate coupled to a gate of a FET. In the present embodiment, a FET similar to memory transistor 150 (FIG. 1A) is used. However, different FET structures can be used in other embodiments.

Figure 3:
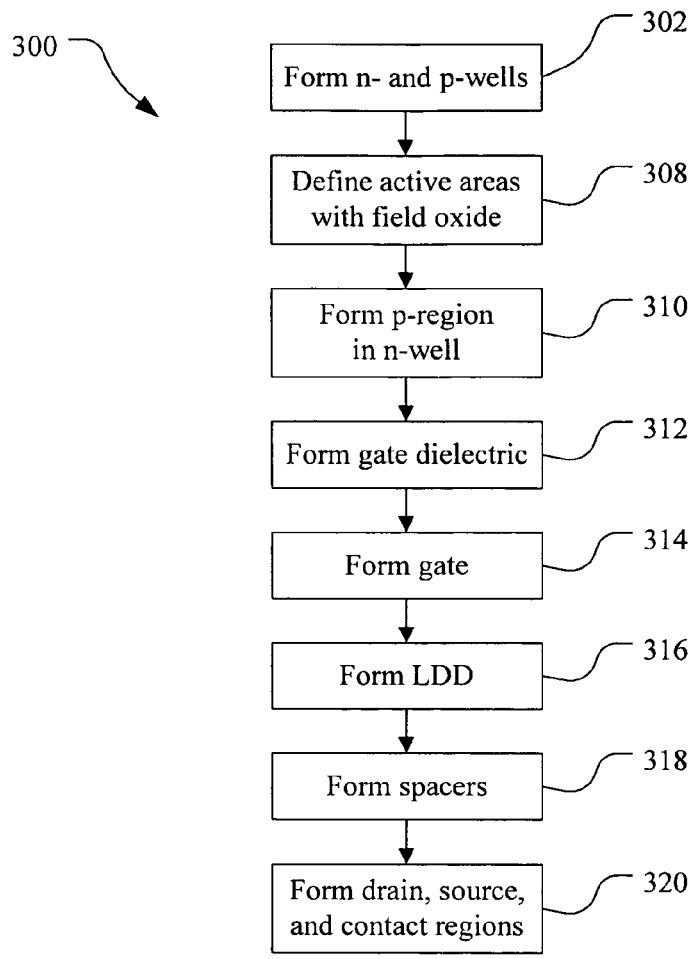
FIG. 3 illustrates a method to make the memory device of FIG. 2 in one embodiment of the invention.

In one embodiment of the invention, a method 300 (FIG. 3) can be used to make memory device 200. Method 300 may be a dedicated process or part of a CMOS process or a BiCMOS (bipolar and complementary metal oxide semiconductor) process. Method 300 is now described in view of FIGS. 1A and 2A.

Process 300 starts with a p-substrate 102. In action 302, n-well 104 and p-well 102 are conventionally formed. For example, wells 104 and 102 are formed by patterning the respective areas and performing ion implantation followed by anneal.

In action 308, the active regions are defined by any of the conventional isolation techniques. For example, active regions are defined by field oxides 106 formed by local oxidation of silicon (LOCOS). Alternatively, active regions are defined by a trench-base isolation process.

Figure 1B:
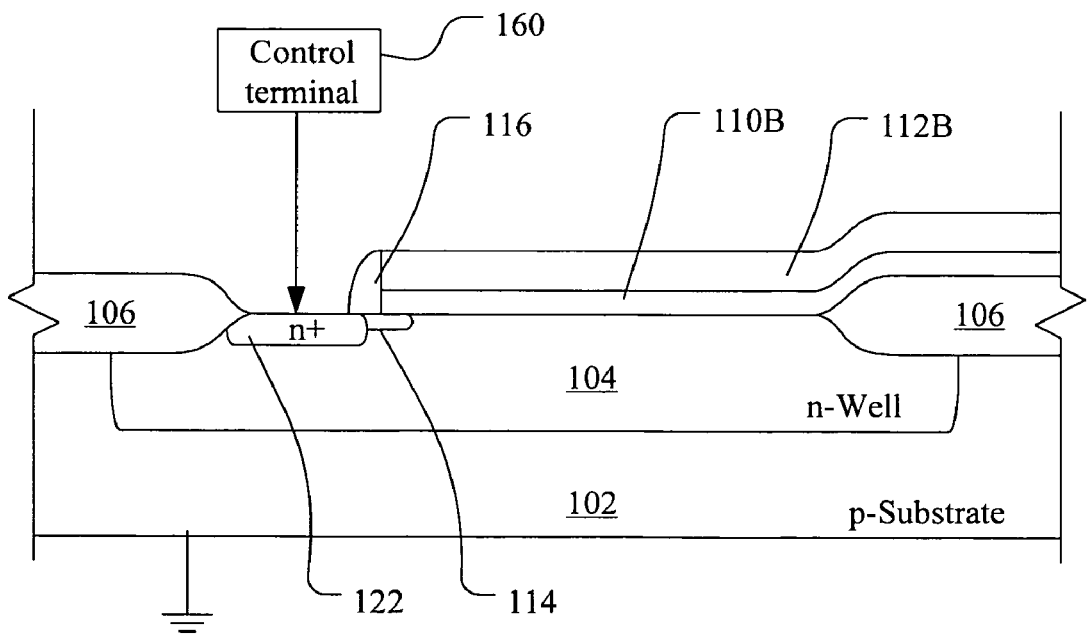
Figure 1C:
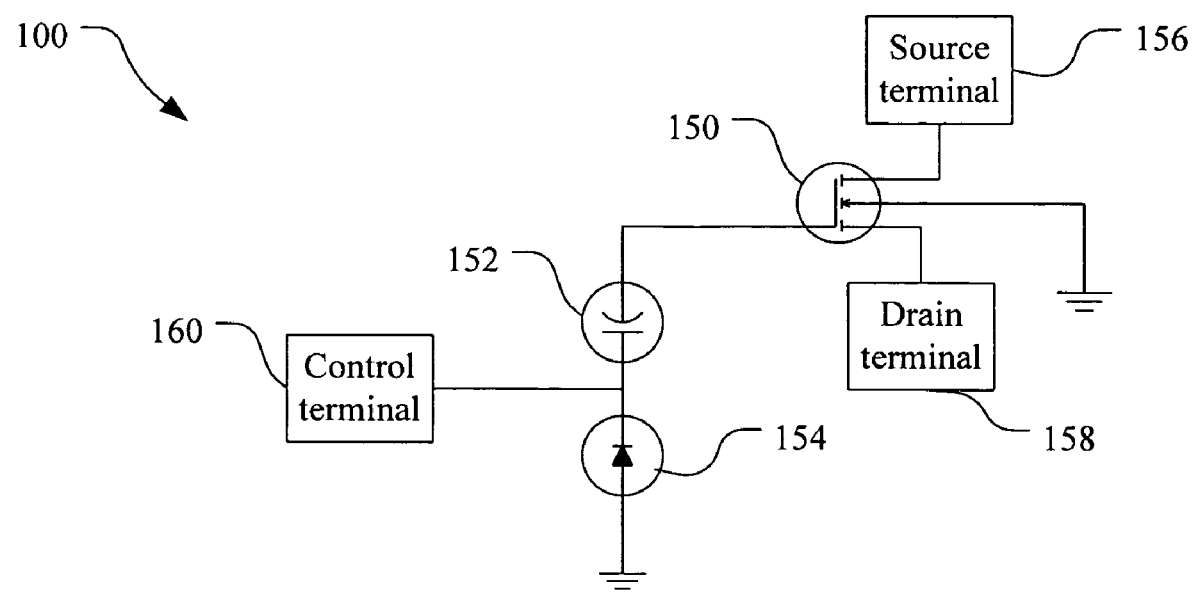
FIG. 1C illustrates an equivalent circuit diagram representing the conventional memory device.

In action 310, a p-type region 280 is formed in n-well 104. For example, p-type region 280 is formed by ion implantation followed by anneal. P-type region 280 is more heavily doped than n-well. In one embodiment where method 300 is part of a BiCMOS process, p-type region 280 is formed as part of the step for forming p-base regions of bipolar transistors on the same substrate. In such an embodiment, there is no extra cost (e.g., no extra mask, implantation, or diffusion) involved in adding p-type region 280 to form the new structure for the coupling capacitor shown in FIG. 2A instead of the structure for the coupling capacitor shown in FIG. 1B.

In action 312, a gate oxide layer is formed on p-substrate 102 to form gate dielectrics 110A and 110B. For example, the gate oxide layer is formed by any oxidization process.

In action 314, a gate conductive layer is formed and patterned to form floating gate 112A and gate conductor 112B. For example, the gate conductive layer is formed by polysilicon deposition and patterned by etching. In the present embodiment, floating gate 112A and gate conductor 112B are electrically coupled by forming both gate conductors from the same conducting trace.

In action 316, NLDD regions 114 of memory transistor 150 are conventionally formed. For example, NLDD regions 114 are formed by ion implantation followed by activation. An additional mask may be needed to preserve other NLDD areas on the wafer.

In action 318, spacers 116 are conventionally formed and patterned. For example, spacers 116 are formed by oxide or silicon nitride deposition followed by anisotropic etching.

In action 320, $n^+$ source region 118, $n^+$ drain region 120, $p^+$ contact region 222, and $n^+$ contact region 224 are conventionally formed. For example, $n^+$ source region 118, $n^+$ drain region 120, $p^+$ contact region 222, and $n^+$ contact region 224 are formed by ion implantation followed by anneal.

FIG. 2A illustrates a coupling capacitor (denoted as coupling capacitor 252 in FIG. 2B) that is formed by p-type region 280 and gate conductor 112B separated by gate dielectric 110B. Dopant/diffusion region 222 is formed in p-type region 280 as a contact for electrically coupling one plate of coupling capacitor 252 to a control terminal 260. Coupling capacitor 252 is isolated from p-substrate 102 by a PN junction between p-type region 280 and n-well 104 (denoted as diode 254 in FIG. 2B). Dopant/diffusion region 224 is formed in n-well 104 as a contact for coupling n-well 104 to a bias terminal 262. In accordance with the present invention, an appropriate voltage is applied to bias terminal 262 to reverse bias the PN junction between p-type region 280 and n-well 104 to prevent conduction to p-substrate 102.

Figure 2B:
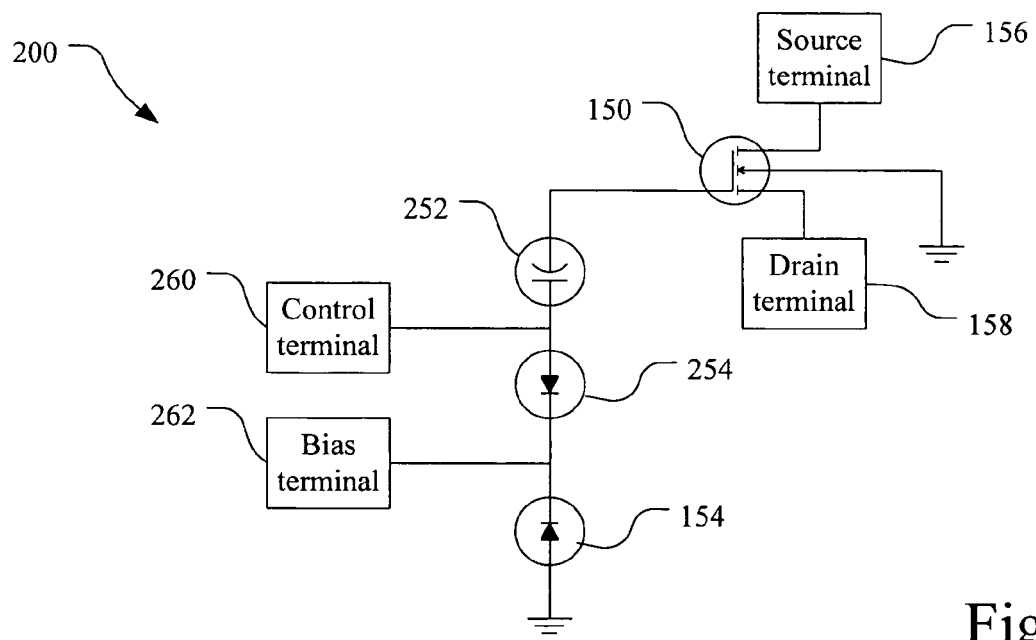
FIG. 2B illustrates an equivalent circuit diagram representing the memory device of FIG. 2A in one embodiment of the invention.

FIG. 2B illustrates an equivalent circuit diagram representing memory device 200. Coupling capacitor 252 couples control terminal 260 to floating gate 112A of memory transistor 150. To write, read, and erase memory transistor 150, various voltages are applied to control terminal 260, source terminal 156, and drain terminal 158. The PN junction between p-substrate 102 and n-well 104 (denoted by diode 154) can be reverse biased by keeping bias terminal 262 more positive than substrate 102. The PN junction denoted by diode 254 can be reverse biased by keeping bias terminal 262 more positive than control terminal 260. However, even if the PN junction denoted by diode 254 becomes forward biased when control terminal 260 is more positive than bias terminal 262, the PN junction denoted by diode 154 remains reverse biased as long as bias terminal 262 is more positive than substrate 102.

One advantage of memory device 200 is that the depletion region under gate dielectric 110B does not extend as far into p-type region 280 of device 200 as it would into n-well 104 of memory device 100 because p-type region 280 is more heavily doped than n-well 104. Thus, the capacitance of coupling capacitor 252 does not decrease as much as coupling capacitor 152.

Another advantage of memory device 200 is that a negative voltage can be applied to control terminal 260 to program memory device 200. This is because the PN junction denoted by diode 254 is reverse biased as long as n-well 104 is kept more positive than p-type region 280. An advantage of applying a negative voltage to control terminal 260 is that a lower positive voltage can be applied to the drain terminal of transistor 150 when erasing memory device 200. Accordingly, in the present embodiment, the drain or the source of transistor 150 does not need to be specially engineered to withstand high voltages. Furthermore, a large negative voltage can be applied to control terminal 260 because the PN junction between p-type region 280 and n-well 104 generally has a high breakdown voltage (e.g., 20 to 30 V).

An advantage of applying a positive voltage to control terminal 260 is that the capacitance of coupling capacitor 252 under the negative voltage relative to p-type region 280 is greater than the capacitance of coupling capacitor 252 under a positive voltage. This is because applying a positive voltage to control terminal 260 accumulates holes under gate dielectric 110B. By increasing the capacitance of coupling capacitor 252, lower voltages can be applied to program memory device 200.

In one embodiment, the following exemplary voltages are applied to program, read, or erase memory cell 200.

|  | Write | Read | Erase |
|---|---|---|---|
| Drain terminal | 6 V | 1 V | Float |
| Source terminal | 0 V | 0 V | 0 V |
| p-well | 0 V | 0 V | 0 V |
| Bias terminal/n-well | 8 V | 5 V | 8 V |
| Control terminal/p-type region | 8 V | 1 V | −12 to −20 V |

Figure 4:
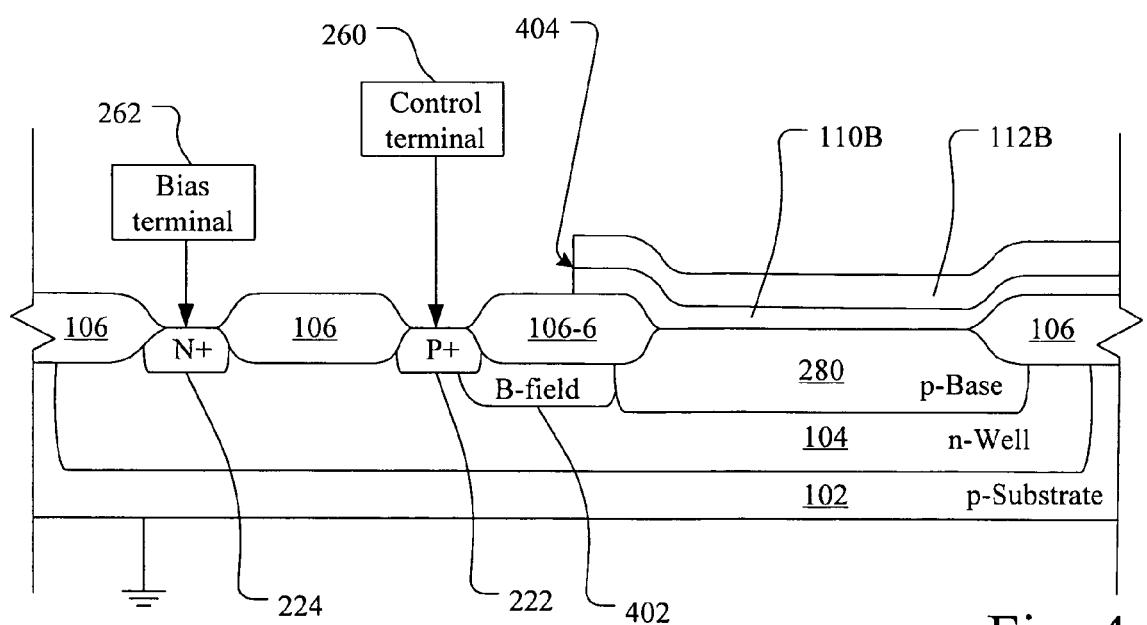
FIG. 4 illustrates a cross-section of a portion of a nonvolatile memory device in another embodiment of the invention.

In one embodiment, a flash memory device includes a coupling capacitor with a structure shown in FIG. 4. The coupling capacitor has one plate coupled to a gate of a FET. In the present embodiment, a FET similar to memory transistor 150 (FIG. 1A) is used. However, different FETs can be used in other embodiments. In the present embodiment, p+contact region 222 is formed in n-well 104 and separated from p-type region 280 by field oxide 106-6. A boron field 402 is implanted in n-well 104 to electrically couple p+ contact region 222 to p-type region 280. Boron field formation may be part of a conventional BiCMOS process used to increase the field threshold voltage. Thus there is no extra cost (e.g., no extra mask, implantation, or diffusion) involved in adding boron field 402 to form the new structure for the coupling capacitor shown in FIG. 4 instead of the structure for the coupling capacitor shown in FIG. 2A.

Whereas gate oxide 110B and gate conductor 112B overlay the substrate surface in FIG. 2A, in the present embodiment gate oxide 110B and gate conductor 112B are etched to overlay field oxide 106-6. After etching, an end 404 of gate conductor 112B is formed atop of field oxide 106-6. By terminating gate conductor 112B on field oxide 106-6 instead of on the substrate, the edge electrical field problem that may occur when gate conductor terminates on the substrate is eliminated and the charge retention of coupling capacitor 252 is believed to be prolonged. This also allows etching of gate conductor 112B and gate oxide 110B to go slightly into field oxide 106-6 without harming the memory device.

Various other adaptations and combinations of features of the embodiments disclosed are within the scope of the invention. For example, although positive and negative voltages are mentioned in the examples with a grounded substrate, one skilled in the art would know that these voltages could be substituted for other voltages that provide similar potential differences. Numerous embodiments are encompassed by the following claims.

What is claimed is:

1. A method for making a semiconductor structure of a memory device, comprising:
    forming a first dopant region of a second conductivity type in a substrate of a first conductivity type;
    forming a bipolar transistor, including forming a base region of the bipolar transistor, the base region being of the first conductivity type;
    forming a second dopant region of the first conductivity type in the first dopant region, the second dopant region being more heavily doped than the first dopant region, the second dopant region being distinct and separate from the base region, said forming a second dopant region and said forming a base region of the bipolar transistor occur in a same step;
    forming a gate dielectric atop the second dopant region;
    forming a first gate conductor atop the gate dielectric;
    forming a field-effect transistor, comprising forming a second gate conductor coupled to the first gate conductor;
    wherein the second dopant region, the gate dielectric, and the first gate conductor form a capacitor.

2. The method of claim 1, wherein the substrate is a p-substrate, the first dopant region is an n-well, and the second dopant region is a p-type region.

3. The method of claim 1, further comprising:
    forming a first contact region of the second conductivity type in the first dopant region, the first contact region being more heavily doped than the first dopant region;
    forming a second contact region of the first conductivity in the second dopant region, the second contact region being more heavily doped than the second dopant region.

4. The method of claim 1, wherein said forming a first gate conductor and said forming a second gate conductor comprise part of forming a same conducting trace.

5. The method of claim 1, wherein said forming a field-effect transistor comprises:
    forming a third dopant region of the first conductivity type in the substrate;
    forming a second gate dielectric atop the third dopant region, wherein the second gate conductor is located atop the second gate dielectric;
    forming a source region of the second conductivity type in the third dopant region; and
    forming a drain region of the second conductivity type in the third dopant region.

6. The method of claim 5, wherein the third dopant region is a p-well.

7. The method of claim 1, wherein the said forming a field-effect transistor comprises:
    forming a second gate dielectric atop the substrate, wherein the second gate conductor is located atop the second gate dielectric;
    forming a source region of the second conductivity in the substrate; and
    forming a drain region of the second conductivity in the substrate.

8. A method for making a semiconductor structure of a memory device, comprising:
    forming a first dopant region of a second conductivity type in a substrate of a first conductivity type;
    forming a second dopant region of the first conductivity type in the first dopant region, the second dopant region being more heavily doped than the first dopant region;
    forming a gate dielectric atop the second dopant region;
    forming a first gate conductor atop the gate dielectric, wherein the second dopant region, the gate dielectric, and the first gate conductor form a capacitor;
    forming a field-effect transistor, comprising forming a second gate conductor coupled to the first gate conductor;
    forming a first contact region of the second conductivity type in the first dopant region, the first contact region being more heavily doped than the first dopant region;
    forming a second contact region of the first conductivity in the first dopant region, the second contact region being more heavily doped than the first dopant region;
    forming a field implant region of the first conductivity in the first dopant region and coupling the second contact region and the second dopant region; and
    forming a field oxide between the second contact region and the second dopant region, wherein the first gate dielectric and the first gate conductor overlay the field oxide so an end of the first gate conductor terminates above the field oxide.

9. The method of claim 8, wherein the substrate is a p-substrate, the first dopant region is an n-well, and the second dopant region is a p-type region.

10. The method of claim 8, wherein said forming a second dopant region comprises part of forming a base region of a bipolar transistor.

11. The method of claim 8, further comprising:
    forming a first contact region of the second conductivity type in the first dopant region, the first contact region being more heavily doped than the first dopant region;
    forming a second contact region of the first conductivity in the second dopant region, the second contact region being more heavily doped than the second dopant region.

12. The method of claim 8, wherein said forming a first gate conductor and said forming a second gate conductor comprise part of forming a same conducting trace.

13. The method of claim 8, wherein said forming a field-effect transistor comprises:

forming a third dopant region of the first conductivity type in the substrate;

forming a second gate dielectric atop the third dopant region, wherein the second gate conductor is located atop the second gate dielectric;

forming a source region of the second conductivity type in the third dopant region; and forming a drain region of the second conductivity type in the third dopant region.

14. The method of claim 13, wherein the third dopant region is a p-well.

15. The method of claim 8, wherein the said forming a field-effect transistor comprises:

forming a second gate dielectric atop the substrate, wherein the second gate conductor is located atop the second gate dielectric;

forming a source region of the second conductivity in the substrate; and forming a drain region of the second conductivity in the substrate.

* * * * *